(12) United States Patent
Hsu

(10) Patent No.: US 10,908,189 B2
(45) Date of Patent: Feb. 2, 2021

(54) CURRENT SENSING DEVICE AND METHOD

(71) Applicant: PROLIFIC TECHNOLOGY INC., Taipei (TW)

(72) Inventor: Chia-Chang Hsu, Hsinchu County (TW)

(73) Assignee: Prolific Technology Inc.

( * ) Notice: Subject to any disclaimer, the term of this patent is extended or adjusted under 35 U.S.C. 154(b) by 143 days.

(21) Appl. No.: 16/200,255

(22) Filed: Nov. 26, 2018

(65) Prior Publication Data

US 2020/0158761 A1    May 21, 2020

(30) Foreign Application Priority Data

Nov. 16, 2018    (TW) .............................. 107140762 A

(51) Int. Cl.
  *G01R 19/00*    (2006.01)
  *G01R 15/20*    (2006.01)
(52) U.S. Cl.
  CPC ....... *G01R 15/207* (2013.01); *G01R 19/0092* (2013.01)

(58) Field of Classification Search
  CPC .. G01R 15/207; G01R 31/083; G01R 15/202; G01R 19/0092; G01R 15/20; G01R 33/0283; G01R 19/15; G01R 31/60; G01R 15/148
  See application file for complete search history.

(56) References Cited

U.S. PATENT DOCUMENTS

| 2010/0090684 | A1* | 4/2010 | Chen | G01R 15/202 324/117 H |
| 2012/0319676 | A1* | 12/2012 | El-Essawy | G01R 33/0283 324/126 |
| 2017/0023625 | A1* | 1/2017 | Hsu | G01R 15/142 |
| 2020/0158761 | A1* | 5/2020 | Hsu | G01R 15/207 |

* cited by examiner

*Primary Examiner* — Alesa Allgood

(57) ABSTRACT

Disclosures of the present invention describe a current sensing device and method, wherein the current sensing device comprises: at least one magnetic sensor, a signal receiving unit and a microprocessor. Particularly, the present invention provides an environmental magnetic field filtering unit and an effective current calculation unit in the microprocessor, such that the microprocessor is able to calculate the value of a current flowing in a specific electrical cable with high accuracy based on a sensing magnetic field outputted from the magnetic sensor.

13 Claims, 13 Drawing Sheets

```
┌─────────────────────────────────────────────────────┐
│   providing a current sensing device 1 comprising at least one   │
│ magnetic sensor 11, a signal receiving unit 12 and a microprocessor │
│     13, wherein the microprocessor 13 is provided with an        │
│   environmental magnetic field filtering unit 131 and an effective │
│            current calculation unit 132 therein                  │
└─────────────────────────────────────────────────────┘
    )
   S1
            ▼
┌─────────────────────────────────────────────────────┐
│  letting the magnetic sensor 11 sense a first induced magnetic field │
│        from an electrical cable 2 at an initial sensing position    │
└─────────────────────────────────────────────────────┘
   )
  S2
            ▼
┌─────────────────────────────────────────────────────┐
│     the microprocessor 13 receiving a first magnetic field         │
│   signal from the magnetic sensor 11 through the signal            │
│                      receiving unit 12                             │
└─────────────────────────────────────────────────────┘
   )
  S3
            ▼
┌─────────────────────────────────────────────────────┐
│    applying a signal filtering process to the first magnetic field │
│   signal by using the environmental magnetic field filtering unit  │
│    131, so as to filtering an environmental magnetic field part out │
│               from the first magnetic field signal                 │
└─────────────────────────────────────────────────────┘
   )
  S4
            ▼
┌─────────────────────────────────────────────────────┐
│        applying a sensing current calculation process to the       │
│      first magnetic field signal by using the effective current    │
│        calculation unit 132, so as to calculate a value of a       │
│              current flowing in the electrical cable 2             │
└─────────────────────────────────────────────────────┘
   )
  S5
```

FIG. 16A

CURRENT SENSING DEVICE AND METHOD

BACKGROUND OF THE INVENTION

1. Field of the Invention

The present invention relates to the technology field of current sensing, and more particularly to a current sensing device and method.

2. Description of the Prior Art

Owing to global warming and lack of energy, Taiwan government often entrusts Taiwan Power Company to hold a variety of energy saving competitions so as to encourage citizens to save electricity enthusiastically. Of course, the citizens saving the most electricity certainly would gain some awards, such as electricity fee reduction. In order to facilitate people monitoring the electricity usage consumed by household appliances by themselves, there are some power sensing devices such as smart meter developed and then provided to sense the electrical characteristics of the household appliances, including voltage, current, electricity usage, power consumption, and electricity fee.

For example, Taiwan Industrial Technology Research Institute (ITRI) has disclosed a non-contact power cable measurement device, which is nicknamed "sticky note meter". The non-contact power sensing device is disclosed in U.S. patent publication No. 2017/0023625A1. FIG. 1 shows a stereo diagram of the power cable measurement device, comprising: a housing 10', a plurality of current sensors 11', a plurality of voltage sensors 12', and an electronic module 13'. From FIG. 1, it is found that the housing 10' is used to sleeve electrical cables 2' therein, and the current sensors 11' and the voltage sensors 12' are disposed on the outer sides of the housing 10'. Particularly, the current sensor 11' is a magnetic sensor, and the voltage sensor 12' is a metal electrode.

The power cable measurement device 1' proposed by ITRI is able to measure multi electrical characteristics of the electrical cables 2', including voltage, current, electricity usage and power consumption. However, resulted from the fact that the power cable measurement device 1' uses several magnetic sensors (i.e., the current sensors 11') to carry out the current sensing, accuracy of the current sensing is found to be varied due to the change of the installing or setting position of the housing 10'. Please refer to FIG. 2, which illustrates a distribution plot of magnetic force lines of two current carrying conductors. From right hand rule of Ampere, it is known that, when an electric current passes through a straight wire, it is able to grab the wire points the thumb in the direction of the conventional current (from positive to negative), such that the fingers point in the direction of the magnetic flux lines. The direction of the magnetic field (counterclockwise instead of clockwise when viewed from the tip of the thumb) is a result of this convention and not an underlying physical phenomenon. The thumb points the flowing direction of the current and the fingers point the direction of magnetic force lines. Moreover, the magnetic field induced by the straight conductor can be calculated by using Biot-Savart law:

$$B = \frac{\mu_0 I}{2\pi r}.$$

Inventors of the present invention further find that the size of the sheath diameter of the electrical cables 2' causes the installing position variation of the housing 10'. After using the power cable measurement device 1' to sense the current flowing in an identical electrical cable 2' two times, the first-time measurement data may differ from the second-time measurement data if the distance between the current sensors 11' and the electrical cable 2' set in the first time measurement is not equal to the distance between of the current sensors 11' and the electrical cable 2' set in the second time measurement. The Biot-Savart law has gave the answer of such phenomenon, that is the magnetic field induced by a straight conductor is in inverse proportion to the distance between the current sensors 11' and the electrical cable 2'. One the other hand, owing to the fact that there are no any specific units arranged in the power cable measurement device 1' for filtering the environmental magnetic field (i.e., noise magnetic field) carried by the sensing magnetic field of the current sensors 11', measurement accuracy of the power cable measurement device 1' is challenged by the engineers skilled in development and manufacture of current sensing devices.

Therefore, in view of the power cable measurement device 1' showing many drawbacks and shortcomings in practical applications, the inventors of the present application have made great efforts to make inventive research thereon and eventually provided a current sensing device and method.

SUMMARY OF THE INVENTION

Conventional non-contact current measurement device does not particularly filter environmental magnetic field out from a sensing signal of magnetic field thereof obtained by using a magnetic sensor to detect an electrical cable, so as to lead a back-end MCU fail to calculate an accuracy value of the current flowing in the electrical cable. The primary objective of the present invention is to provide a current sensing device and method, wherein the current sensing device comprises: at least one magnetic sensor, a signal receiving unit and a microprocessor. Particularly, the present invention provides an environmental magnetic field filtering unit and an effective current calculation unit in the microprocessor, such that the microprocessor is able to calculate the value of a current flowing in a specific electrical cable with high accuracy based on a sensing magnetic field outputted from the magnetic sensor.

In order to achieve the primary objective of the present invention, the inventor of the present invention provides an embodiment for the current sensing device, comprising:

at least one magnetic sensor, being located at an initial sensing position for being spaced apart from an electrical cable by a sensing distance, so as to sensing a first induced magnetic field from the electrical cable;

a signal receiving unit, being electrically connected to the magnetic sensor 1 for receiving a first magnetic field signal; and a microprocessor, being electrically connected to the signal receiving unit, and provided with an environmental magnetic field filtering unit and an effective current calculation unit therein;

wherein the environmental magnetic field filtering unit is configured to filter an environmental magnetic field part carried by the first magnetic field signal, such that the effective current calculation unit calculates a value of an effective sensing current based on the first magnetic field signal without the environmental magnetic field part.

Moreover, for achieving the primary objective of the present invention, the inventor of the present invention also provides an embodiment for the current sensing method, comprising following steps:
(1) providing a current sensing device comprising at least one magnetic sensor, a signal receiving unit and a microprocessor, wherein the microprocessor is provided with an environmental magnetic field filtering unit and an effective current calculation unit therein;
(2) letting the magnetic sensor sense a first induced magnetic field from an electrical cable at an initial sensing position;
(3) the microprocessor receiving a first magnetic field signal from the magnetic sensor 11 through the signal receiving unit;
(4) applying a signal filtering process to the first magnetic field signal by using the environmental magnetic field filtering unit, so as to filtering an environmental magnetic field part out from the first magnetic field signal; and
(5) applying a sensing current calculation process to the first magnetic field signal by using the effective current calculation unit, so as to calculate a value of an effective sensing current.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein:

FIG. 16A, FIG. 16B and FIG. 16C show flowcharts of a current sensing method according to the present invention.

DETAILED DESCRIPTION OF THE PREFERRED EMBODIMENTS

To more clearly describe current sensing device and method according to the present invention, embodiments of the present invention will be described in detail with reference to the attached drawings hereinafter.

First Embodiment

Figure 3:
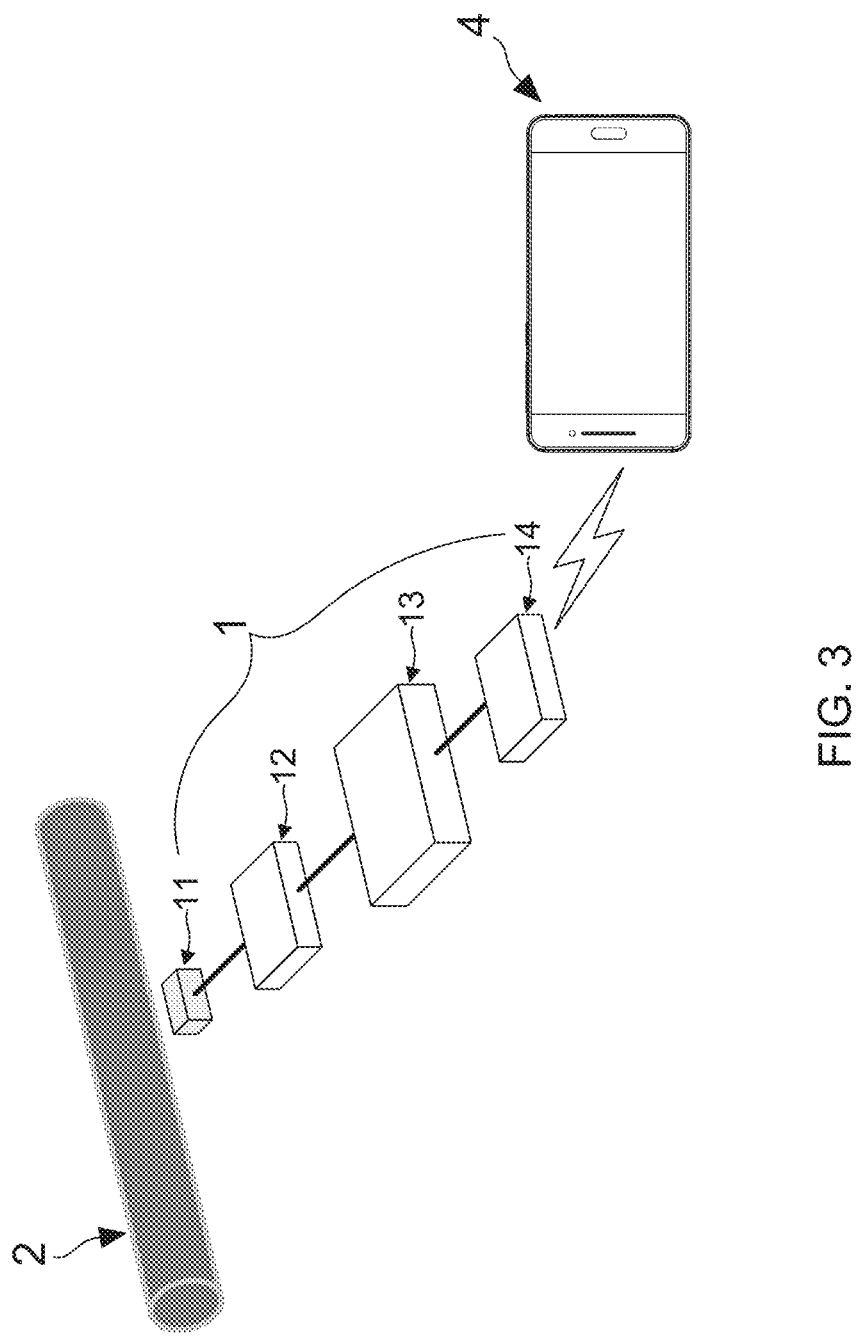
FIG. 3 shows a stereo diagram of a first embodiment of a current sensing device according to the present invention.
Figure 4:
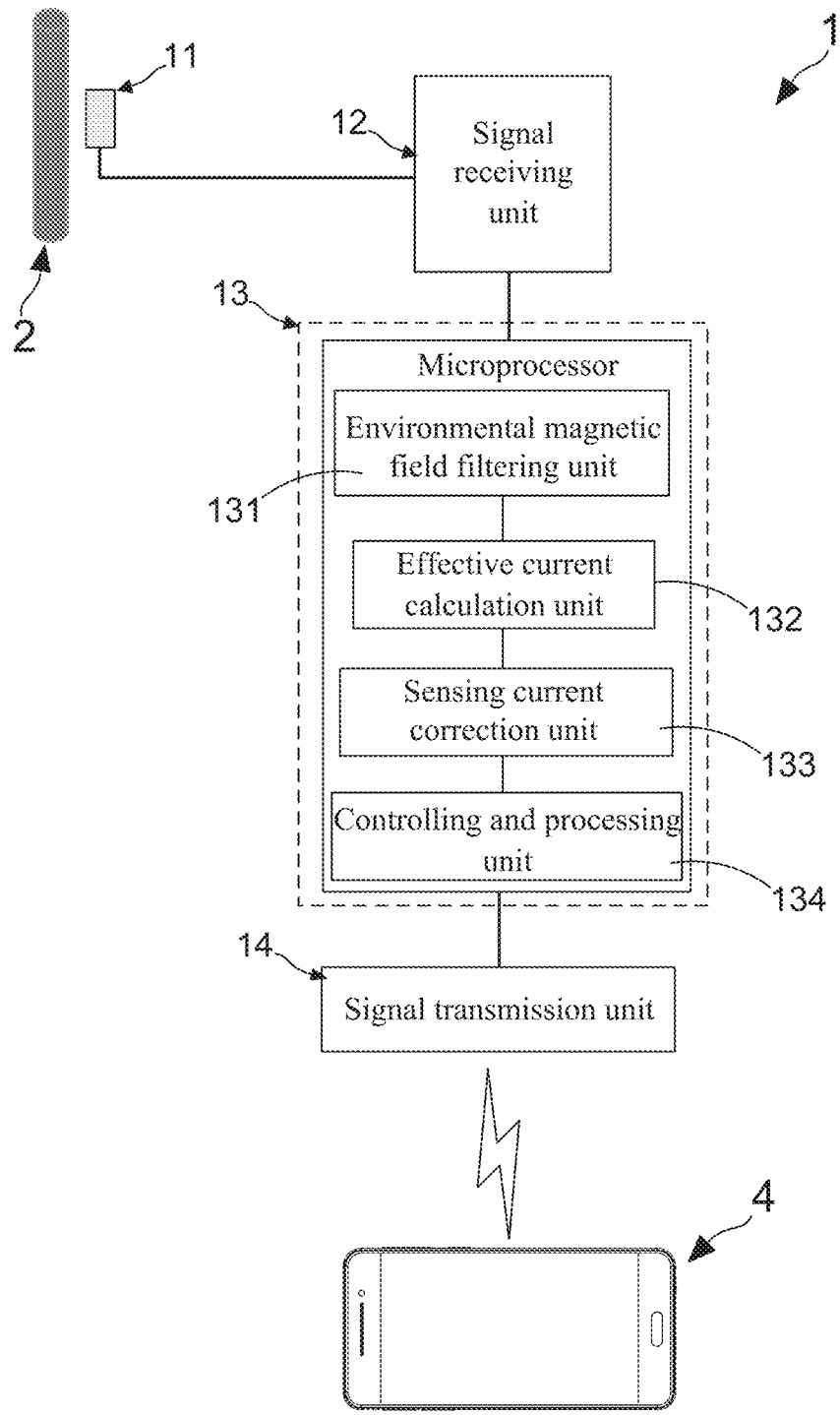
FIG. 4 shows a schematic framework view of the first embodiment of the current sensing device.
Figure 5:
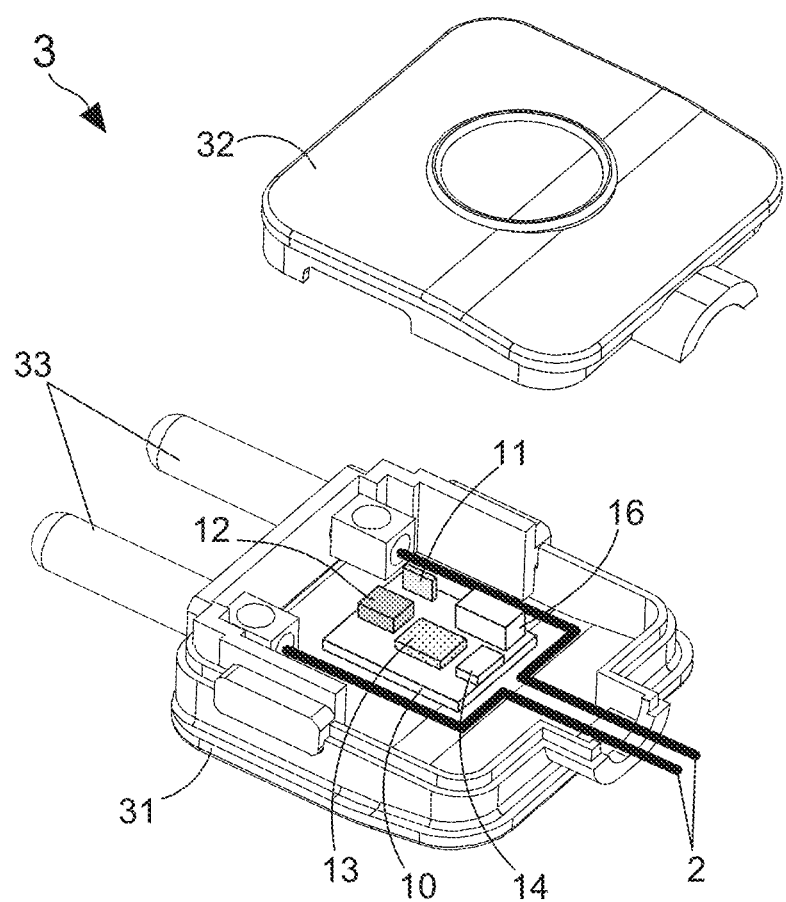
FIG. 5 shows a partial exploded view of a power plug integrated with the current sensing device.

The present invention mainly discloses a current sensing device, which is able to be implemented into any one type of power device, such as non-contact power measurement device, power meter, power plug, power converter, power adapter, or power extension device. FIG. 3 shows a stereo diagram of a first embodiment of the current sensing device according to the present invention, and FIG. 4 illustrates a schematic framework view of the first embodiment of the current sensing device. Moreover, FIG. 5 shows a partial exploded view of a power plug integrated with the current sensing device of the present invention. FIG. 5 depicts that the power plug 3 comprises a base 31, a cover 32, two electrical connection terminals 33, and two electrical cables 2. On the other hand, FIG. 3 and FIG. 4 depict that the current sensing device 1 of the present invention mainly comprises: at least one magnetic sensor 11, a signal receiving unit 12, a microprocessor 13, and a signal transmission unit 14.

For facilitating the current sensing device 1 being integrated into the power plug 3, the signal receiving unit 12, the microprocessor 13 and the signal transmission unit 14 are disposed on a PCB 10, so as to subsequently dispose the PCB 10 in the base 31 of the power plug 3. According to the particular design of the present invention, the magnetic sensor 11 is disposed in the based 31, and is located at an initial sensing position for being spaced apart from an electrical cable 2 by a sensing distance. There are commonly one electrical cable (Live wire) and the other one electrical cable (Neutral wire) set to connect with the two electrical connection terminals 33 in the base 31, wherein the magnetic sensor 11 is close to the Live wire. It is worth noting that, a power supply 16 is also disposed on the PCB 10 for supplying power to the signal receiving unit 12, the microprocessor 13 and the signal transmission unit 14. The power supply unit 16 can be a battery, a power supply, a power converter, or a power regulator.

By such arrangement, the magnetic sensor 11 can be controlled by the microprocessor 13 so as to sensing a first induced magnetic field from the electrical cable 2. Subsequently, the microprocessor 13 is able to receive a first magnetic field signal from the magnetic sensor 11 through the signal receiving unit 12. Particularly, the present invention provides an environmental magnetic field filtering unit 131 and an effective current calculation unit 132 in the microprocessor 13. Therefore, after receiving the first magnetic field signal, the microprocessor 13 firstly applies a signal filtering process to the first magnetic field signal by using the environmental magnetic field filtering unit 131, so as to filtering an environmental magnetic field part out from the first magnetic field signal. Consequently, the microprocessor 13 applies a sensing current calculation process to the first magnetic field signal by using the effective current calculation unit 132, such that a value of a current flowing in the electrical cable 2 is calculated. Furthermore, through the signal transmission unit such as a wired signal transmission interface or a wireless signal transmission interface, the sensing current data can be uploaded to an external electronic device 4 like smart phone, smart watch, smart glasses, tablet PC, laptop computer, or desk computer.

Engineers skilled in development and manufacture of current sensing device using magnetic sensors should know that, the microprocessor 13 converts the sensing magnetic field signal to sensing current data by using Biot-Savart law:

$$B = \frac{\mu_0 I}{2\pi r}.$$

However, inventors of the present invention find that, if the an environmental magnetic field part carried by the sensing magnetic field signal does not be screened out, a considerable difference will be produced between the actual value of the current flowing in the electrical cable 2 and the calculation value of the sensing current. Accordingly, an environmental magnetic field filtering unit 131 is particularly provided in the microprocessor 13, wherein the environmental magnetic field filtering unit 131 is embedded with an environmental magnetic field filtering algorithm so as to apply a signal filtering process to the sensing magnetic field signal. Moreover, an effective current calculation unit 132 is also provided in the microprocessor 13, wherein the effective current calculation unit 132 is embedded with an effective current calculation algorithm so as to apply a sensing current calculation process to the sensing magnetic field signal. The environmental magnetic field filtering algorithm and the effective current calculation algorithm are presented by following mathematical equations (1) and (2). Moreover, variables or parameters used in the two mathematical formulas are summarized in following table (1).

$$\bar{I} = \sum_{i=1}^{n} \frac{(I_i)}{n} \tag{1}$$

$$I_{RMS} = \sqrt{\sum_{i=1}^{n} \frac{(I_i - \bar{I})^2}{n}} \tag{2}$$

TABLE 1

| Variables or parameters | Descriptions |
| --- | --- |
| $I_i$ | Sensing current |
| $\bar{I}$ | Sensing current after being applied with a signal filtering process |
| $I_{RMS}$ | Effective sensing current |

First Way to Correct the Sensing Current

Figure 6:
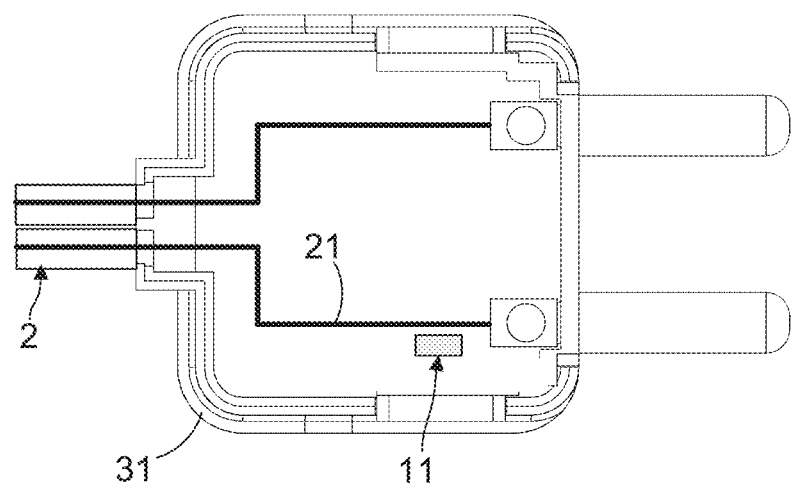
FIG. 6 shows a top view of a base of the power plug and a magnetic sensor.
Figure 7:
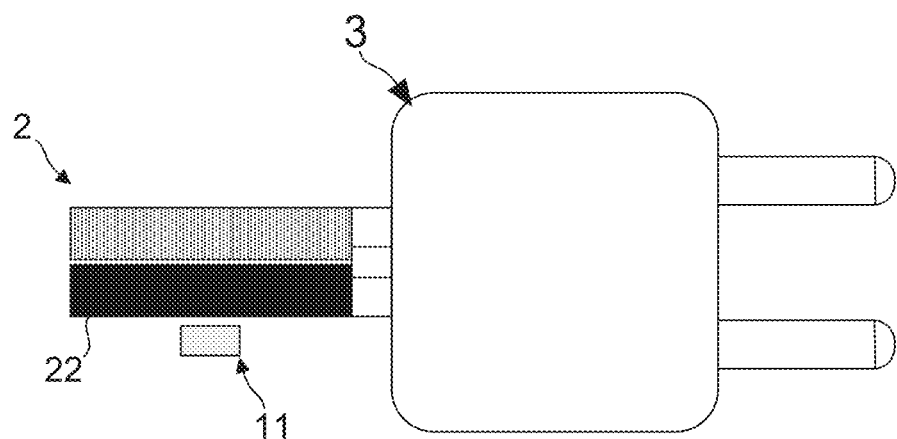
FIG. 7 shows a top view of the power plug and the electrical cables.

FIG. 6 shows a top view of the base of the power plug and one magnetic sensor, and FIG. 7 illustrates a top view of the power plug and the electrical cables. FIG. 6 depicts that the magnetic sensor 11 is disposed in the base 31 of the power plug 3, and is located close to an electrical wire 21 of one electrical cable 2. On the other hand, FIG. 7 depicts that the magnetic sensor 11 is moved out of the base 31, and is disposed close to the insulation sheath 22 of the identical electrical cable 2. After the microprocessor 13 control the magnetic sensor 11 sense a first induced magnetic field from the electrical cable 2, the environmental magnetic field filtering unit 131 is subsequently configured to apply a signal filtering process to a first magnetic field signal receiving from the magnetic sensor 11, and the effective current calculation unit 132 is adopted for continuously apply a sensing current calculation process to the first magnetic field signal received from the effective current calculation unit 132. Eventually, a sensing current correction unit 133 provided in the microprocessor 13 is used to apply a correction process to the value of an effective sensing current calculated by the effective current calculation unit 132. Particularly, the sensing current correction unit 133 is coupled between the effective current calculation unit 132 and the controlling and processing unit 134, and is provided with a first sensing current correction algorithm to complete the correction process. The first sensing current correction algorithm is presented as following mathematical equations (I') and (II'). Moreover, variables or parameters used in the two mathematical formulas are summarized in following table (2).

$$B_1 = \frac{\mu_0 I_1}{2\pi r_1} \tag{I'}$$

$$I_{Cal} = (I_{RMS})/k, \; k = I_{mea}/I_1 \tag{II'}$$

TABLE 2

| Variables or parameters | Descriptions |
| --- | --- |
| $B_1$ | First magnetic field signal outputted by the magnetic sensor 11 |
| $I_1$ | Sensing current calculated by using above-presented mathematical equation (I'). |
| $I_{RMS}$ | Effective sensing current, obtained by applying the first magnetic field signal with a signal filtering process and then applying a conversion process to the first magnetic field signal by using above-presented mathematical equation (2). |
| $I_{cal}$ | Corrected sensing current, obtained by applying with a correction process to the effective sensing current. |
| $I_{mea}$ | Measurement current measured from the electrical cable 2 provided by a contact-type current measurement device. |
| k | Current correction parameter |
| $r_1$ | Sensing distance obtained by calculating the difference between the initial sensing position of the magnetic sensor 11 and the electrical cable 2. |

Figure 1:
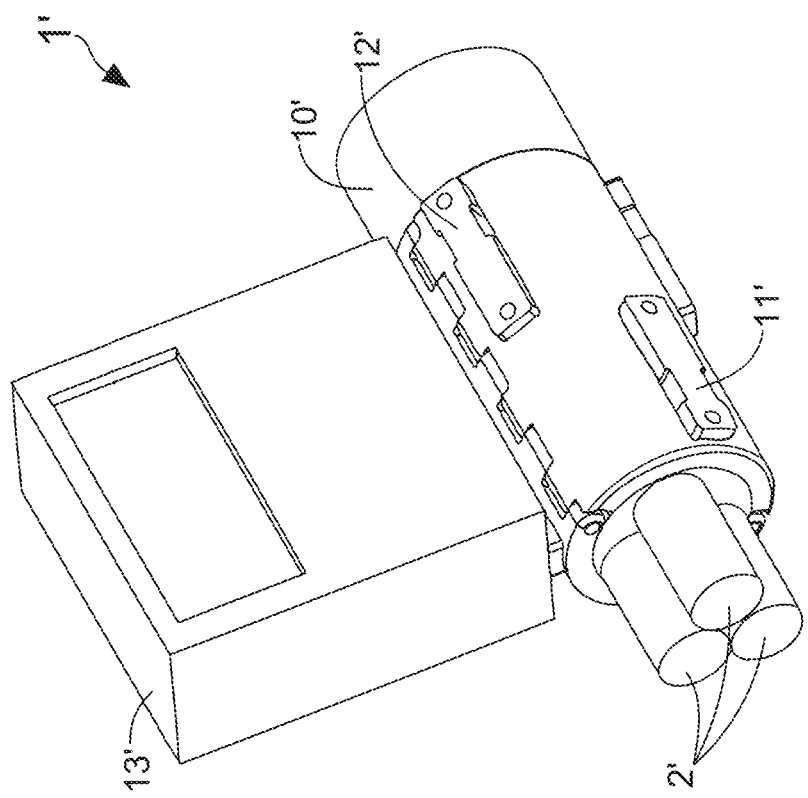
FIG. 1 shows a stereo diagram of the power cable measurement device.
Figure 2:
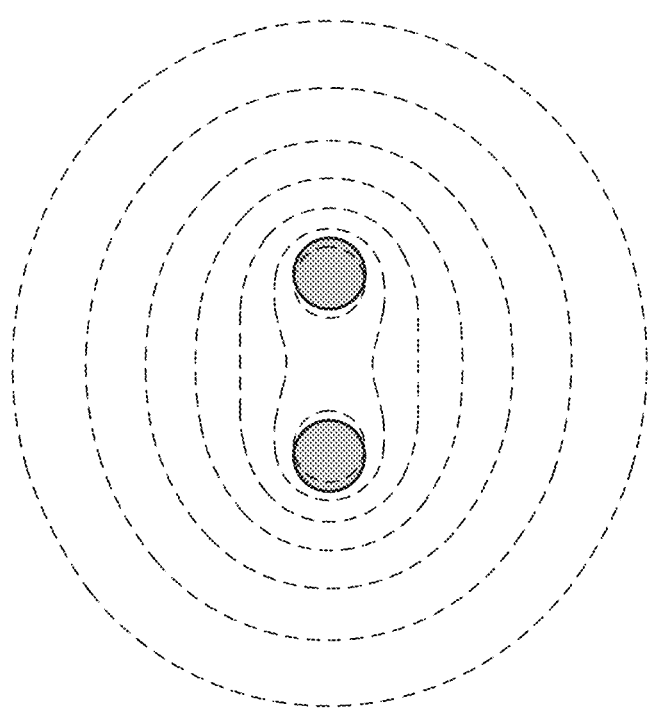
FIG. 2 shows a distribution plot of magnetic force lines of two current carrying conductors.
Figure 8:
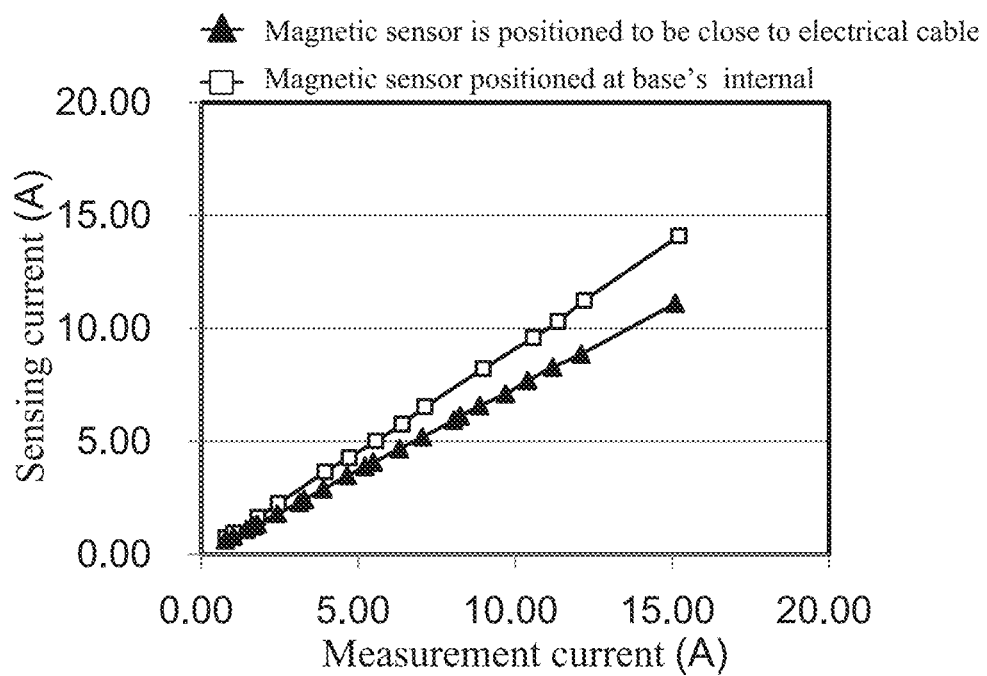
FIG. 8 shows a data plot of measurement current versus sensing current.

FIG. 8 shows a data plot of measurement current versus sensing current. It is worth explaining that, data of FIG. 8 are collected by disposing the magnetic sensor 11 in the base 31 of the power plug 3 (as shown in FIG. 6) and close to the insulation sheath 22 of the identical electrical cable 2 (as shown in FIG. 7), respectively. In addition, the collected data of sensing current does not be further collected. From the data of FIG. 8, it is found that, the R-squared value of the trend line of the sensing current data received from the magnetic sensor 11 in the base 31 of the power plug 3 is more close to 1 than that of the sensing current data received from the magnetic sensor 11 disposed close to the insulation sheath 22. Moreover, according to the distribution plot of magnetic force lines shown in FIG. 2, it is extrapolated that the intensity of the sensing magnetic field of the magnetic sensor 11 disposed in the base 31 (FIG. 6) certainly greater than that of the magnetic sensor 11 disposed close to the electrical cable 2 (FIG. 7), and this extrapolation has an explanation for why the R-squared value of the trend line of the sensing current data received from the magnetic sensor 11 in the base 31 of the power plug 3 is more close to 1 than that of the sensing current data received from the magnetic sensor 11 disposed close to the insulation sheath 22.

Figure 9:
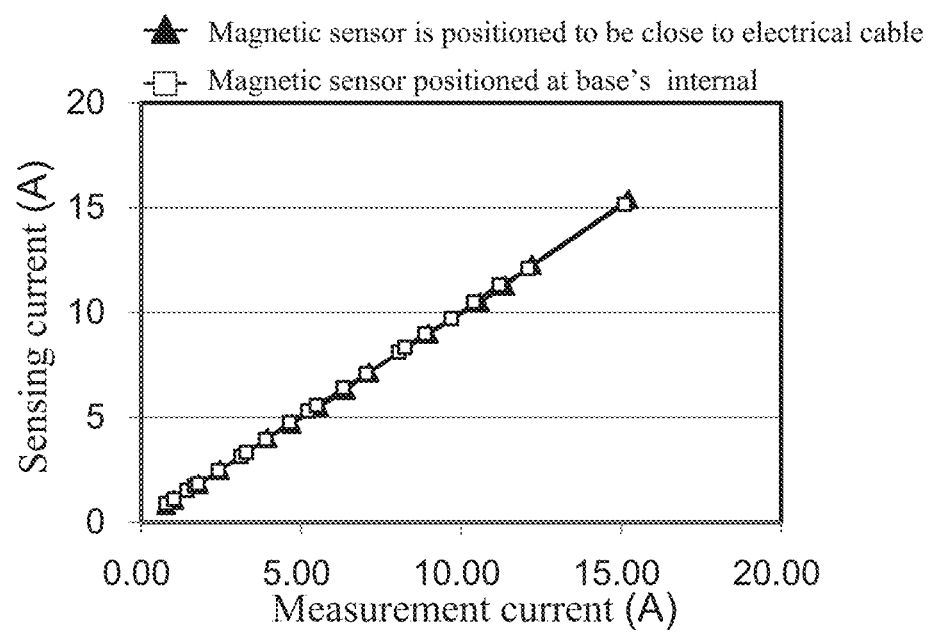
FIG. 9 shows a data plot of measurement current versus sensing current.

FIG. 9 also shows a data plot of measurement current versus sensing current, and data of FIG. 9 are also collected by disposing the magnetic sensor 11 in the base 31 of the power plug 3 (as shown in FIG. 6) and close to the insulation sheath 22 of the identical electrical cable 2 (as shown in FIG.

Figure 10:
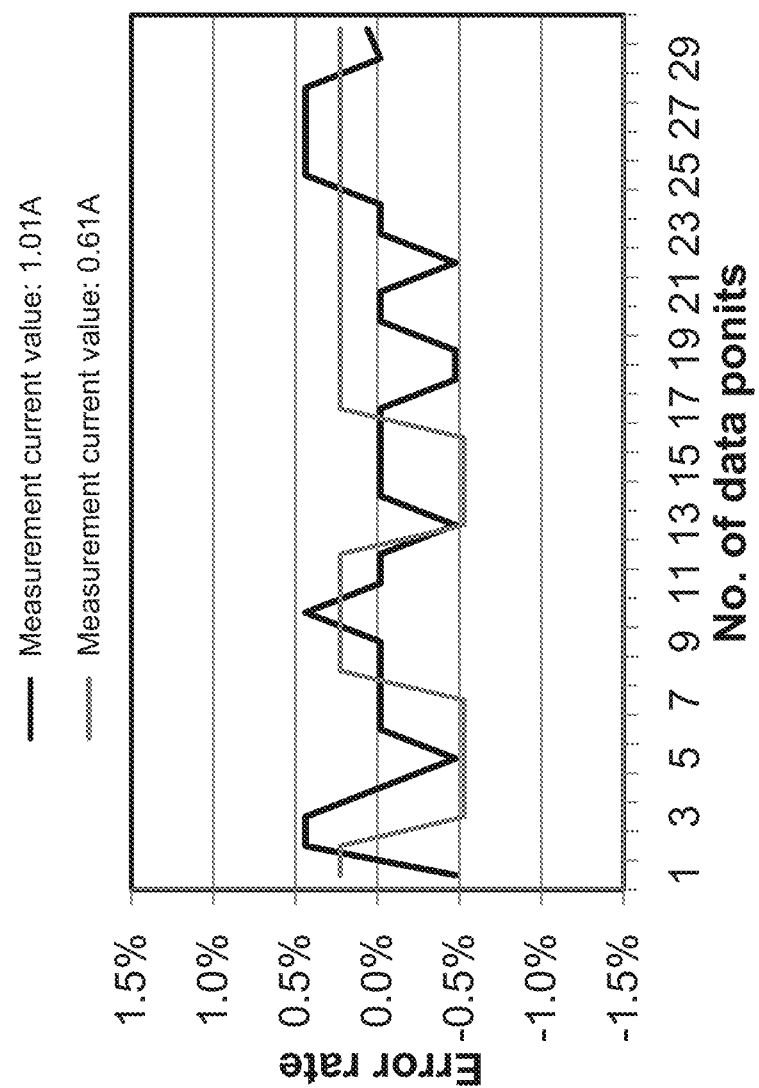
FIG. 10 shows a data plot for describing the stability of the sensing current data.

7), respectively. Particularly, all collected sensing current data are further collected by the sensing current correction unit 133. From the data of FIG. 9, it is found that, both the R-squared value of the trend line of the sensing current data received from the magnetic sensor 11 in the base 31 of the power plug 3 and that of the sensing current data received from the magnetic sensor 11 disposed close to the insulation sheath 22 does approach 1. On the other hand, FIG. 10 shows a data plot for describing the stability of the sensing current data. In order to verify the accuracy and the stability of the corrected sensing current obtained by using the current sensing device 1 of the present invention, measurement current are collected by using a standard contact-type current meter for being used as contrast data of the corrected sensing current. As a result, data of FIG. 10 report that, the corrected sensing current obtained by using the current sensing device 1 exhibit a sensing accuracy of ±5%, compared to the contrast data.

Second Embodiment

Figure 11:
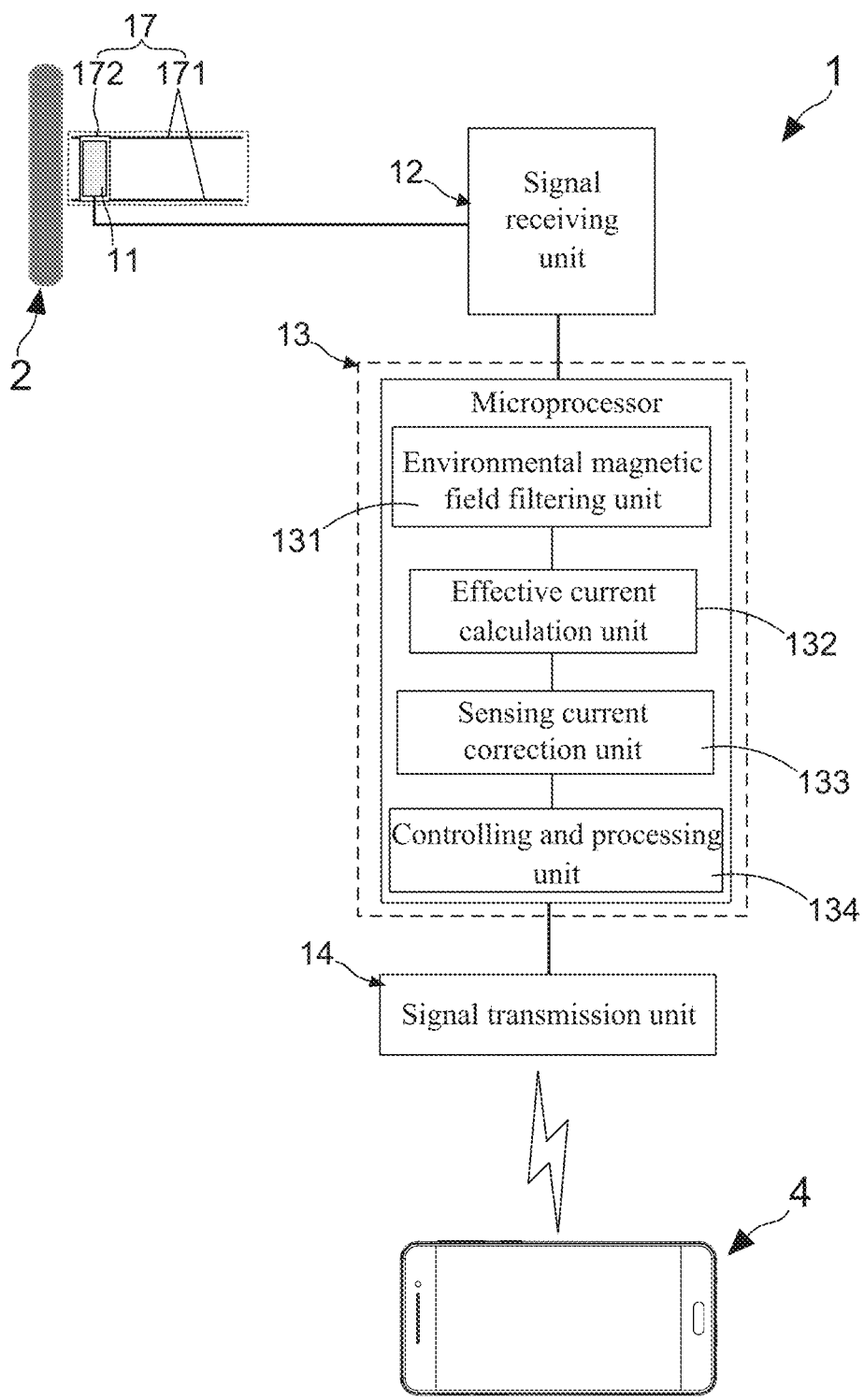
FIG. 11 shows a schematic framework view of a second embodiment of the current sensing device according to the present invention.

FIG. 11 shows a schematic framework view of a second embodiment of the current sensing device according to the present invention. After comparing FIG. 11 with FIG. 4, it is understood that the second embodiment of the current sensing device 1 further comprises a sensing position adjusting unit 17, which is used for moving the magnetic sensor 11 from the initial sensing position to a first sensing position, such that the magnetic sensor 11 senses a second induced magnetic field from the electrical cable 2 at the first sensing position, so as to output a second magnetic field signal.

Second Way to Correct the Sensing Current

Figure 12:
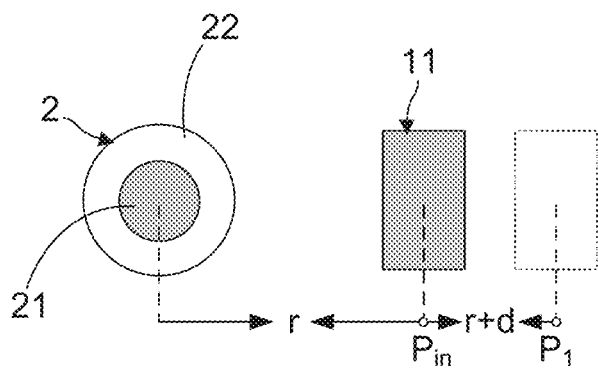
FIG. 12 shows a cross-sectional side view of the electrical cable and the magnetic sensor.

FIG. 12 shows a cross-sectional side view of the electrical cable and the magnetic sensor. FIG. 12 depicts that an initial sensing position $P_{in}$ is spaced apart from an electrical wire 21 of an electrical cable 2 by distance "r", and there is a distance "r+d" between a first sensing position $P_1$ and the electrical wire 21. Particularly, in second embodiment, the sensing current correction unit 133 is provided with a second sensing current correction algorithm to complete the correction process, and the second sensing current correction algorithm is presented as following mathematical equations (I), (II) and (III). Moreover, variables or parameters used in the two mathematical formulas are summarized in following table (3).

$$B_{in} = \frac{\mu_0 I}{2\pi r} \quad (I)$$

$$B_1 = \frac{\mu_0 I}{2\pi(r'+d)} \Rightarrow r' = \frac{\mu_0 I}{2\pi(B_1)} - d \quad (II)$$

$$I_{Cal} = \frac{\mu_0 B_{in}}{2\pi r'} \quad (III)$$

TABLE 3

| Variables or parameters | Descriptions |
| --- | --- |
| $B_{in}$ | (First) Magnetic field signal, obtained by disposing the magnetic sensor 11 at the initial sensing position Pin to sense the induced magnetic field of the electrical cable 2. |
| $B_1$ | Second magnetic field signal, obtained by disposing the magnetic sensor 11 at the first sensing position $P_1$ to sense the induced magnetic field of the electrical wire 21. |
| $\mu_0$ | Magnetic permeability of vacuum |

TABLE 3-continued

| Variables or parameters | Descriptions |
| --- | --- |
| I | Effective sensing current calculated by using the mathematical equation (I) |
| Ical | Corrected (effective) sensing current |
| r | Distance between the initial sensing position Pin and the electrical wire 21 |
| r' | Calibration value of r |
| D | Distance between the initial sensing position Pin and first sensing position |

Therefore, it is understood that the value of "r" includes the thickness value of the insulation sheath 22 of the electrical cable 2 and the value of the distance between the magnetic sensor 11 and the insulation sheath 22. It is worth particularly explaining that, in the second way to correct the sensing current, the (effective) sensing current obtained by disposing the magnetic sensor 11 at the initial sensing position Pin is supposed to be correct firstly. Next, the magnetic sensor 11 is moved from the initial sensing position Pin to the first sensing position $P_1$ for collecting the induced magnetic field of the electrical cable 2 again, and then both a second magnetic field outputted by the magnetic sensor 11 and the (effective) sensing current calculated by the mathematical equation (I) are substituted into the mathematical equation (II), so as to calculate the calibration value (i.e., r') of r. As a result, both the first magnetic field and the r' are substituted into the mathematical equation (III) for getting the corrected (effective) sensing current Ical.

Figure 13:
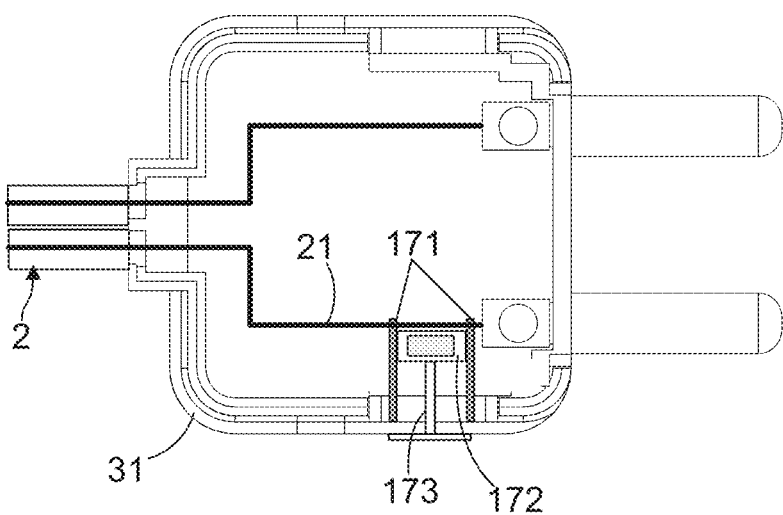
FIG. 13 shows a top view of the base of the power plug, the magnetic sensor, and a sensor position adjusting unit.
Figure 14:
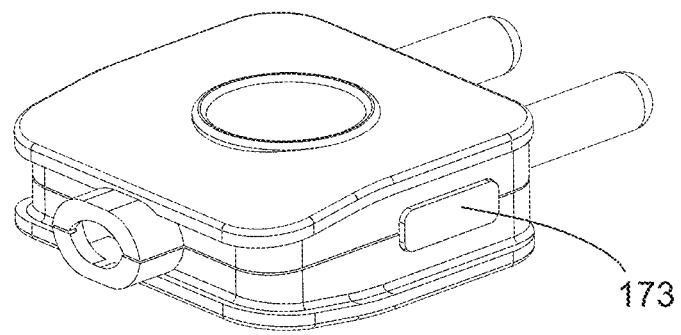
FIG. 14 shows a stereo diagram of the power plug.

Please refer to FIG. 13 showing a top view of the base of the power plug, the magnetic sensor. Moreover, please simultaneously refer to FIG. 14, which illustrate a stereo diagram of the power plug. FIG. 11, FIG. 13 and FIG. 14 depict that the sensing position adjusting unit 17 comprises a rail unit 171, a sensor carrying member 172 slidable on the rail unit 171, and a controller 173 for controlling the sensor carrying member 172 to move on the rail unit 171. Apparently, after the magnetic sensor 11 finish the sensing of the induced magnetic field of the electrical cable 2, the controller 173 is configured to control the sensor carrying member 172 to move from an initial sensing position Pin to a first sensing position P1 with carrying the magnetic sensor 11. Herein, it is noted that, the sensing position adjusting unit 17 is not limited to be disposed in the base 31 of the power plug 3, it can also be disposed in the outside of the base 31 with the magnetic sensor 11.

Figure 15:
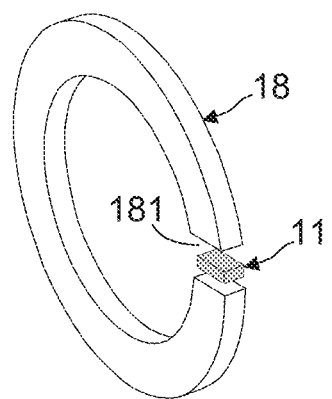
FIG. 15 shows a stereo diagram of a magnetic ring and the magnetic sensor.

Referring to FIG. 3 again, and please simultaneously refer to FIG. 15 showing a stereo diagram of a magnetic ring and the magnetic sensor. When practically applying the current sensing device 1 of the present invention, a magnetic ring 18 can also be adopted for surrounding the electrical cable 2. From FIG. 15, it is found that the magnetic ring 18 has a notch 181 for receiving the magnetic sensor 11, such that at least one magnetic field is induced by the current flowing in the electrical cable 2 is guided by the magnetic ring 18 so as to pass one side of the notch 181 from an opposite side of the notch 181. In addition, an electromagnetic shielding layer can also be provided for covering magnetic ring 18.

Figure 16B:
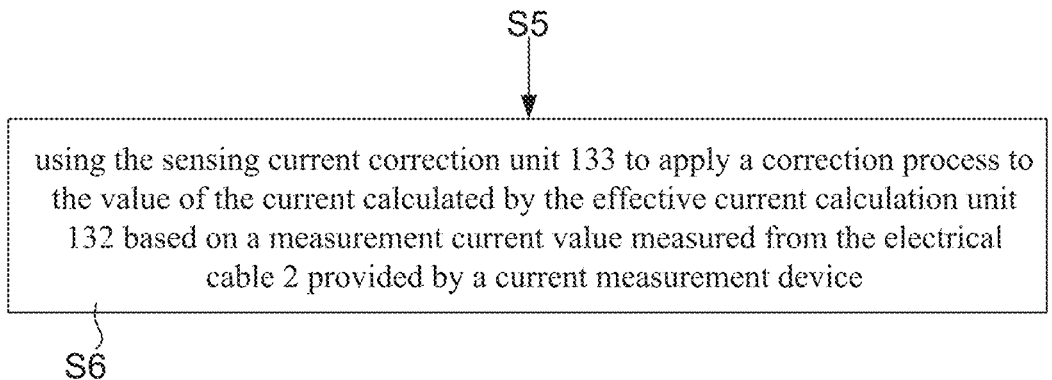
Figure 16C:
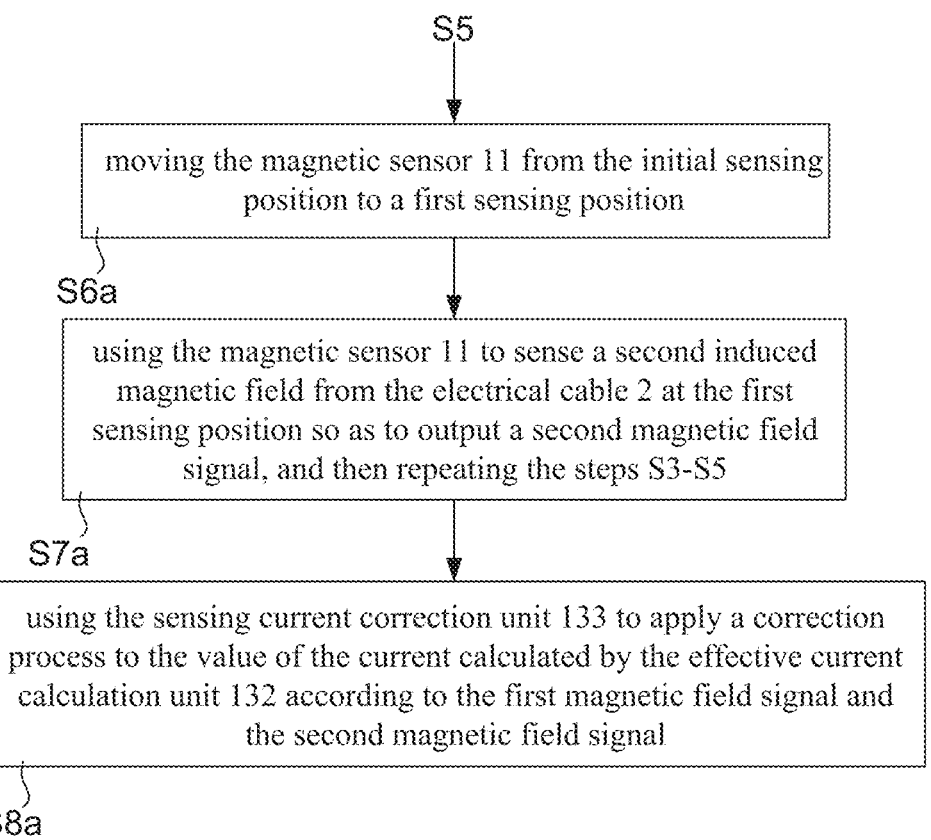

On the other hand, the present invention also provides a current sensing method capable of being implemented into any one type of power device, such as non-contact power measurement device, power meter, power plug, power converter, power adapter, or power extension device. FIG. 16A, FIG. 16B and FIG. 16C show flowcharts of the current sensing method according to the present invention, wherein the current sensing method mainly comprises following 5 steps:

step S1: providing a current sensing device 1 comprising at least one magnetic sensor 11, a signal receiving unit 12 and a microprocessor 13, wherein the microprocessor 13 is provided with an environmental magnetic field filtering unit 131 and an effective current calculation unit 132 therein;

step S2: letting the magnetic sensor 11 sense a first induced magnetic field from an electrical cable 2 at an initial sensing position;

step S3: the microprocessor 13 receiving a first magnetic field signal from the magnetic sensor 11 through the signal receiving unit 12;

step S4: applying a signal filtering process to the first magnetic field signal by using the environmental magnetic field filtering unit 131, so as to filtering an environmental magnetic field part out from the first magnetic field signal; and step S5: applying a sensing current calculation process to the first magnetic field signal by using the effective current calculation unit 132, so as to calculate a value of an effective sensing current.

This current sensing method can be implemented into in the microprocessor 13 by a form of application program, library, variables, or operands. Moreover, as FIG. 16B shows, the current sensing method further comprises step S6 for correspondingly drive the current sensing device 1 of FIG. 3 to complete current correction process. When the step S6 is executed, the sensing current correction unit 133 is configured to apply a correction process to the value of the current calculated by the effective current calculation unit 132 based on a measurement current value measured from the electrical cable 2 provided by a current measurement device.

For making the step S4 and step S5 to be enable, the environmental magnetic field filtering unit 131 is provided with an environmental magnetic field filtering algorithm to complete the signal filtering process, and the effective current calculation unit 132 is provided with an effective current calculation algorithm to complete the sensing current calculation process. The environmental magnetic field filtering algorithm and the effective current calculation algorithm are presented by above-described mathematical equations (1) and (2). In addition, for making the step S6 to be enable, the sensing current correction unit 133 is provided with a first sensing current correction algorithm to complete the correction process, and the first sensing current correction algorithm is presented by above-described mathematical equations (I') and (II').

Moreover, as FIG. 16C shows, the current sensing method further comprises steps S6a, S7a and S8a for correspondingly drive the current sensing device 1 of FIG. 11 to complete current correction process. The steps S6a, S7a and S8a are summarized as follows:

step S6a: moving the magnetic sensor 11 from the initial sensing position Pin to a first sensing position $P_1$;

step S7a: using the magnetic sensor 11 to sense a second induced magnetic field from the electrical cable 2 at the first sensing position so as to output a second magnetic field signal, and then repeating the steps S3-S5; and step S8a: using the sensing current correction unit 133 to apply a correction process to the value of the current calculated by the effective current calculation unit 132 according to the first magnetic field signal and the second magnetic field signal.

For making the step S8a to be enable, the sensing current correction unit 133 is provided with a second sensing current correction algorithm to complete the correction process, and the second sensing current correction algorithm is presented by above-described mathematical equations (I), (II) and (III).

Therefore, through above descriptions, the current sensing device and method provided by the present invention has been introduced completely and clearly; in summary, the present invention includes the advantages of:

(1) Conventional non-contact current measurement device does not particularly filter environmental magnetic field out from a sensing signal of magnetic field thereof obtained by using a magnetic sensor to detect an electrical cable, so as to lead a back-end MCU to fail to calculate an accuracy value of the current flowing in the electrical cable. Particularly, the present invention provides a current sensing device 1, comprising: at least one magnetic sensor 11, a signal receiving unit 12 and a microprocessor 13. It is worth emphasizing that, the present invention provides an environmental magnetic field filtering unit 131 and an effective current calculation unit 132 in the microprocessor 13, such that the microprocessor 13 is able to calculate the value of a current flowing in a specific electrical cable 2 with high accuracy based on at least one sensing magnetic field outputted from the magnetic sensor 11.

(2) On the other hand, the present invention further added a sensing position adjusting unit 17 into the framework of the current sensing device 1, which is used for moving the magnetic sensor 11 from the initial sensing position to a first sensing position, such that the magnetic sensor 11 senses a second induced magnetic field from the electrical cable 2 at the first sensing position, so as to output a second magnetic field signal. Therefore, the sensing current correction unit 133 is able to complete the a correction process to the value of the effective sensing current calculated by the effective current calculation unit 132 based on the first magnetic field signal and the second magnetic field signal.

The above description is made on embodiments of the present invention. However, the embodiments are not intended to limit scope of the present invention, and all equivalent implementations or alterations within the spirit of the present invention still fall within the scope of the present invention.

What is claimed is:

1. A current sensing device, comprising:
at least one magnetic sensor, being located at an initial sensing position for being spaced apart from an electrical cable by a sensing distance; wherein the magnetic sensor is used to sense a first induced magnetic field from the electrical cable, and a sensing position adjusting unit is connected to the at least one magnetic sensor; and
a microprocessor, being configured to perform a plurality of functions comprises:
(a) receiving a first magnetic field signal from the magnetic sensor through a signal receiving unit;
(b) applying a signal filtering process to the first magnetic field signal, thereby filtering an environmental magnetic field part out of the first magnetic field signal;
(c) applying a sensing current calculation process to the first magnetic field signal, so as to calculate a value of an effective sensing current; and
(b) controlling the sensing position adjusting unit to move the magnetic sensor from the initial sensing position to a first sensing position, such that the magnetic sensor senses a second induced magnetic field from the electrical cable at the first sensing position, so as to transmit a second magnetic field signal to the microprocessor via the signal receiving unit.

2. The current sensing device of claim 1, wherein the magnetic sensor, the signal receiving unit and the microprocessor are integrated in a power device selected from the group consisting of non-contact power measurement device, power meter, power plug, power converter, power adapter, and power extension device.

3. The current sensing device of claim 1, wherein the plurality of functions further comprises:
(e) communicating with an external electronic device through a signal transmission unit.

4. The current sensing device of claim 1, based on a measurement current value measured from the electrical cable provided wherein the plurality of functions further comprises:
(d1) applying a correction process to the value of the effective sensing current based on a measurement current value that is measured from the electrical cable provided by controlling a current measurement device.

5. The current sensing device of claim 1, wherein the plurality of functions further comprises:
(d2) applying a correction process to the value of the effective sensing current according to the first magnetic field signal and the second magnetic field signal.

6. The current sensing device of claim 1, further comprising:
a magnetic ring, being adopted for surrounding the electrical cable, and having a notch for receiving the magnetic sensor;
wherein at least one magnetic field induced by the current flowing in the electrical cable is guided by the magnetic ring so as to pass one side of the notch from an opposite side of the notch.

7. The current sensing device of claim 6, further comprising an electromagnetic shielding layer for covering magnetic ring.

8. The current sensing device of claim 1, further comprising a power supply unit for supply power to the signal receiving unit and the microprocessor.

9. The current sensing device of claim 8, wherein the power supply unit is selected from the group consisting of battery, power supply, power converter, and power regulator.

10. A current sensing method, comprising following steps:
(1) providing a current sensing device comprising at least one magnetic sensor, a signal receiving unit and a microprocessor;
(2) letting the magnetic sensor sense a first induced magnetic field from an electrical cable at an initial sensing position;
(3) the microprocessor receiving a first magnetic field signal from the magnetic sensor through the signal receiving unit;
(4) the microprocessor applying a signal filtering process to the first magnetic field signal, so as to filtering an environmental magnetic field part out from the first magnetic field signal; and
(5) the microprocessor applying a sensing current calculation process to the first magnetic field signal, so as to calculate a value of an effective sensing current;
(6a) moving the magnetic sensor from the initial sensing position to a first sensing position;
(7a) using the magnetic sensor to sense a second induced magnetic field from the electrical cable at the first sensing position so as to output a second magnetic field signal, and then repeating the steps (3)-(5); and
(8a) using the microprocessor to apply a correction process to the value of the current calculated according to the first magnetic field signal and the second magnetic field signal.

11. The current sensing method of claim 10, wherein the microprocessor is using a sensing current correction algorithm to complete the correction process.

12. The current sensing method of claim 10, wherein the environmental magnetic field filtering unit is using an environmental magnetic field filtering algorithm to complete the signal filtering process.

13. The current sensing method device of claim 12, wherein the microprocessor is using an effective current calculation algorithm to complete the sensing current calculation process.

* * * * *